United States Patent
Kubota et al.

(10) Patent No.: US 6,399,282 B1
(45) Date of Patent: Jun. 4, 2002

(54) METHOD FOR FORMING CONDUCTIVE PATTERN AND PRODUCING CERAMIC MULTI-LAYER SUBSTRATE

(75) Inventors: Masahiro Kubota, Shiga-ken; Michiaki Iha, Kusatsu; Shizuharu Watanabe, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/505,736

(22) Filed: Feb. 16, 2000

(30) Foreign Application Priority Data

Mar. 25, 1999 (JP) .............................. 11-081540

(51) Int. Cl.[7] .............................. G03C 1/73; H01B 1/22; G03F 7/16
(52) U.S. Cl. .................. 430/311; 430/322; 430/329; 252/252; 252/512; 252/513; 252/514
(58) Field of Search ................ 430/311, 322, 430/329; 252/512, 513, 514

(56) References Cited

U.S. PATENT DOCUMENTS

| | | | |
|---|---|---|---|
| 5,045,141 A | | 9/1991 | Salensky et al. |
| 5,925,444 A | * | 7/1999 | Katsumura et al. ......... 428/209 |
| 5,951,917 A | * | 9/1999 | Nayak et al. ............... 252/512 |
| 6,156,237 A | * | 12/2000 | Kubota et al. .............. 252/512 |
| 6,214,527 B1 | * | 4/2001 | Kosaka et al. .............. 430/319 |
| 2001/0006451 A1 | * | 7/2001 | Miyazaki et al. .......... 361/321.2 |

OTHER PUBLICATIONS

Patent Abstracts of Japan; publication No. 10075039; published Mar. 17, 1998.
Patent Abstracts of Japan; publication No. 09218508; published Aug. 19, 1997.
Patent Abstracts of Japan; publication No. 06290635; published Oct. 18, 1994.
Japanese Document JP 2000292916A Kubota et al. Abstract Oct. 20, 2000.*
Japanese Document JP 2000338655A Kubota et al. Abstract Dec. 8, 2000.*

* cited by examiner

Primary Examiner—Janet Baxter
Assistant Examiner—Yvette M. Clarke
(74) Attorney, Agent, or Firm—Dickstein Shapiro Morin & Oshinsky LLP

(57) ABSTRACT

A method for forming a conductive pattern includes: applying a photosensitive conductive paste to a support 1 to thereby form a film 2, which paste contains an organic binder having an acidic functional group, a photosensitive organic component, a multivalent metallic powder, and a mono-ol compound having a boiling point of about 178° C. or more, an anion-adsorbing material and/or a thixotropic agent; exposing and developing the film 2 to thereby form conductive patterns 3a and 3b; and transferring the conductive patterns 3a and 3b, which are formed on the support 1, onto a ceramic green sheet 6. The invention also discloses a method for producing a ceramic multi-layer substrate.

12 Claims, 2 Drawing Sheets

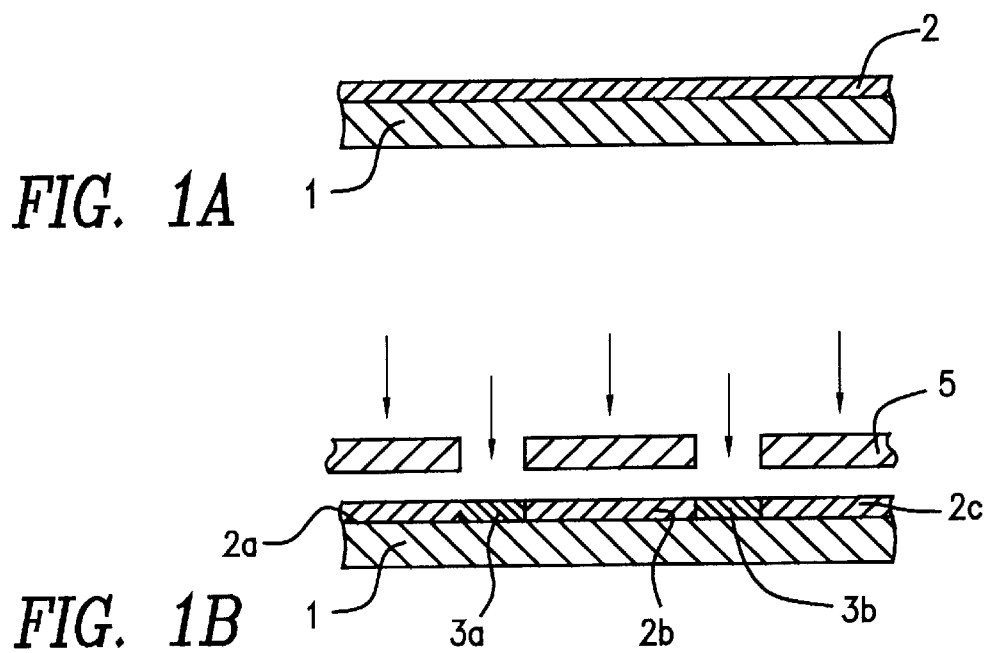
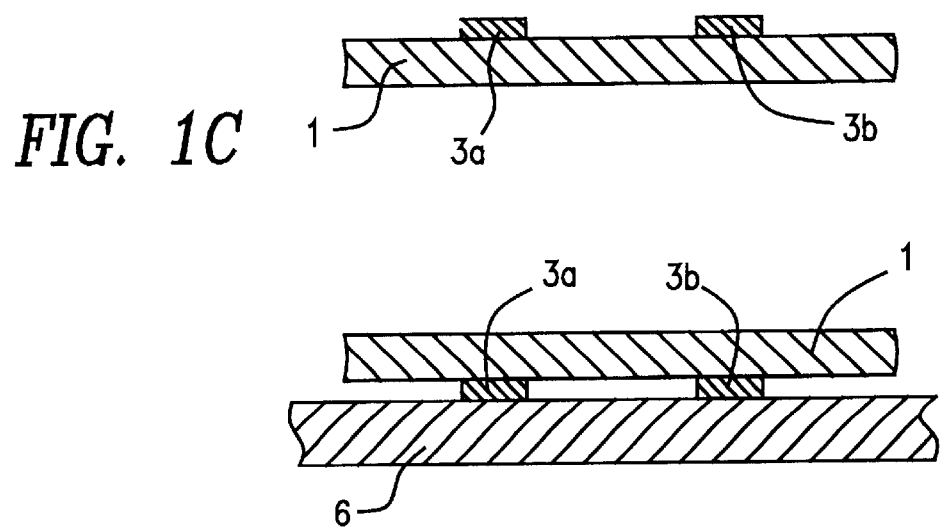
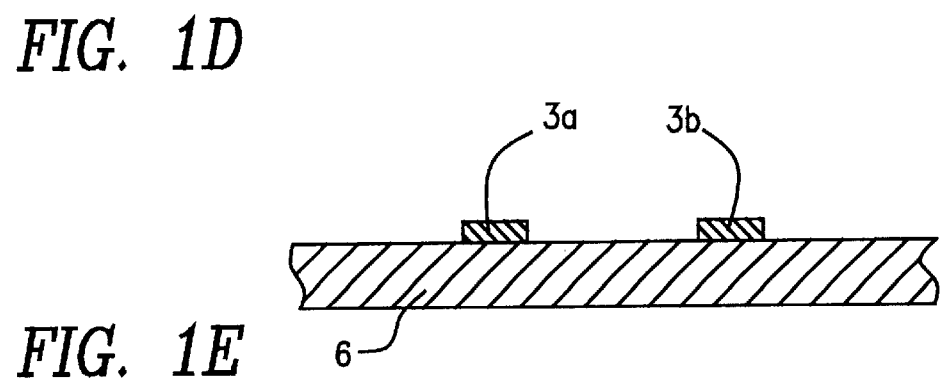

US 6,399,282 B1

METHOD FOR FORMING CONDUCTIVE PATTERN AND PRODUCING CERAMIC MULTI-LAYER SUBSTRATE

BACKGROUND OF THE INVENTION

1. Field of the Invention

The present invention relates to a method for forming a conductive pattern by use of a photosensitive conductive paste and to a method for producing a ceramic multi-layer substrate.

2. Description of the Related Art

Recently, high-frequency electronic components used in mobile communication devices, satellite broadcasting receiving devices, computers and the like having small size and high performance have been demanded. Concurrently, wiring patterns of high-frequency electronic components are required to have increased density and signal speed. In order to increase density and signal speed in the wiring pattern, conductive patterns such as wiring and electrodes must be made finer and yet form a thicker film.

A conventional method for forming a conductive pattern of a high-frequency electronic component involves first forming a pattern on an insulating substrate by use of a conductive paste comprising powder of a multivalent metal such as copper and an organic vehicle containing an organic binder and an organic solvent. Subsequently, the resultant pattern is dried and fired. In this method, a conductive pattern is generally formed through screen printing, and the lower limit of the width and pitch of the thus-formed conductive pattern is approximately 50 µm.

Japanese Patent Application Laid-Open (kokai) No. 99596/1988 discloses a transferring method wherein conductive patterns are formed on a plurality of supports and the patterns are transferred onto green sheets. By means of the transferring method, bleeding and blurring can be suppressed and a fine conductive pattern can be formed with high accuracy, as compared with a conductive pattern formed on a green sheet through screen printing. In the transferring method, however, conductive patterns are formed on supports through screen printing and thus, the lower limit of the width and pitch of the conductive pattern is approximately 50 µm as in the described conventional method.

In addition, Japanese Patent Application Laid-Open (kokai) Nos. 75039/1998, 200260/1998, and 209334/1998 disclose a method employing the above-described transferring method wherein a conductive pattern is formed on a support through photolithography by use of a photosensitive conductive paste, and the resultant pattern is transferred onto a ceramic green sheet. By means of this method, bleeding and blurring of a conductive pattern can be suppressed and a very fine pattern having a width and a pitch of 50 µm or less can be formed.

Recently, in consideration of the environment, it is demanded that photolithography development be carried out by use of water or alkali. Therefore, the photosensitive organic binder contains an acidic functional group such as a carboxyl group, which group has a property to release a proton.

In the case of employment of such a photosensitive organic binder in the above-described transferring method, particularly when powder of a multivalent metal such as copper is used as a conductive material, ions of the multivalent metal may react with anions of the organic binder, which anions are formed after protons are released, to thereby form a three-dimensional network by ionic cross-linking. In addition, the photosensitive conductive paste may become a gel.

When a photosensitive conductive paste becomes a gel, the paste has high viscosity and application of the paste to a support becomes difficult. Even if the paste is applied to the support before occurrence of gelation, unexposed portions of the paste may fail to dissolve in a developer during exposure and development. In addition, ability to transfer onto a ceramic green sheet is reduced.

In order to prevent gelation of a photosensitive conductive paste, Japanese Patent Application Laid-Open (kokai) No. 218509/1997 discloses a method wherein a phosphorous-containing compound such as phosphoric acid is incorporated into the paste, and Japanese Patent Application Laid-Open (kokali) Nos. 218508/1997 and 209334/1998 disclose a method wherein a compound having an azole structure such as benzotriazole is incorporated into the paste. However, these methods in practice enable only slight retardation of gelation of the paste, and formation of a fine conductive pattern is difficult through the above-described transferring method.

In addition, in order to prevent gelation of a photosensitive paste effectively, Japanese Patent Application Laid-Open (kokai) No. 171107/1998 discloses a method wherein 3-methyl-3-methoxybutanol is added into the paste. However, 3-methyl-3-methoxybutanol has a boiling point as low as 174° C., and thus, when a film formed on a support is dried, the 3-methyl-3-methoxybutanol may vaporize from the film and the effect of preventing gelation may be considerably reduced. As is described above, when coating film after drying becomes gel, unexposed portions of the film may not dissolve into the developer and transferability onto a ceramic green sheet may be reduced.

SUMMARY OF THE INVENTION

To overcome the above described problems, preferred embodiments of the present invention provide a method for forming a conductive pattern, which method enables sufficient suppression of gelation of a photosensitive conductive paste and of a dried film, and enables formation of a fine conductive pattern with high accuracy.

Further, preferred embodiments of the present invention provide a ceramic multi-layer substrate having sufficiently increased signal speed and wiring density by the formation of a fine conductive pattern on a ceramic green sheet with high accuracy.

Accordingly, the present invention provides a method for forming a conductive pattern, comprising the steps of:

applying a photosensitive conductive paste to a support, the photosensitive conductive paste containing an organic binder having an acidic functional group, a photosensitive organic component, a multivalent metallic powder and mono-ol compound having a boiling point of about 178° C. or more;

forming a predetermined conductive pattern by exposure and development of the photosensitive conductive paste; and transferring the conductive pattern formed on the support onto a substrate. Hereinafter, this method will be referred to as the first method for forming a conductive pattern of the present invention.

The prevent invention also provides a method for forming a conductive pattern, comprising the steps of:

applying a photosensitive conductive paste to a support, the photosensitive conductive paste containing an organic binder having an acidic functional group, a photosensitive organic component, a multivalent metallic powder, and an anion-adsorbing substance having ability to adsorb the anion of the organic binder;

forming a predetermined conductive pattern by exposure and development of the photosensitive conductive paste; and transferring the conductive pattern formed on the support onto a substrate. Hereinafter, this method will be referred to as the second method for forming a conductive pattern of the present invention.

The present invention also provides a method for forming a conductive pattern, comprising the steps of:

applying a photosensitive conductive paste to a support, the photosensitive conductive paste containing an organic binder having an acidic functional group, a photosensitive organic component, a multivalent metallic powder, and a thixotropic agent;

forming a predetermined conductive pattern by exposure and development of the photosensitive conductive paste; and transferring the conductive pattern formed on the support onto a substrate. Hereinafter, this method will be referred to as the third method for forming a conductive pattern of the present invention.

The present invention further provides a method for producing a ceramic multi-layer substrate, comprising the steps of:

applying a photosensitive conductive paste to a support, the photosensitive conductive paste containing an organic binder having an acidic functional group, a photosensitive organic component, a multivalent metallic powder and mono-ol compound having a boiling point of about 178° C. or more;

forming a predetermined conductive pattern by exposure and development of the photosensitive conductive paste;

transferring the conductive pattern formed on the support onto a ceramic green sheet; and stacking a plurality of the ceramic green sheets having the conductive pattern and firing the resultant laminate. Hereinafter, this method will be referred to as the first method for producing a ceramic multi-layer substrate of the present invention.

The present invention also provides a method for producing a ceramic multi-layer substrate, comprising the steps of:

applying a photosensitive conductive paste to a support, the photosensitive conductive paste containing an organic binder having an acidic functional group, a photosensitive organic component, a multivalent metallic powder and an anion-adsorbing substance having ability to adsorb the anion of the organic binder;

forming a predetermined conductive pattern by exposure and development of the photosensitive conductive paste;

transferring the conductive pattern formed on the support onto a ceramic green sheet; and stacking a plurality of the ceramic green sheets having the conductive pattern and firing the resultant laminate. Hereinafter, this method will be referred to as the second method for producing a ceramic multi-layer substrate of the present invention.

The present invention also provides a method for producing a ceramic multi-layer substrate, comprising the steps of:

applying a photosensitive conductive paste to a support, the photosensitive conductive paste containing an organic binder having an acidic functional group, a photosensitive organic component, a multivalent metallic powder and a thixotropic agent;

forming a predetermined conductive pattern by exposure and development of the photosensitive conductive paste;

transferring the conductive pattern formed on the support onto a ceramic green sheet; and stacking a plurality of the ceramic green sheets having the conductive pattern and firing the resultant laminate. Hereinafter, the method will be referred to as the third method for producing a ceramic multi-layer substrate of the present invention.

In the first method for forming a conductive pattern of the present invention, a photosensitive conductive paste contains one or more mono-ol compounds having a boiling point of about 178° C. or more, and therefore gelation of the paste and a dried film can be sufficiently suppressed and a fine conductive pattern can be formed at high accuracy.

In the first method for producing a ceramic multi-layer substrate of the present invention, a photosensitive conductive paste contains the mono-ol compound having a boiling point of about 178° C. or more, and therefore gelation of the paste and a dried film can be sufficiently suppressed and a fine conductive pattern can be formed on a ceramic green sheet with high accuracy. As a result, a ceramic multi-layer substrate having sufficiently increased signal speed and wiring density can be produced.

The hydroxyl group in a mono-ol compound has very high ability to bind to a multivalent metallic ion as compared with an acidic functional group of an organic binder (particularly a carboxylic group). Therefore, the reaction between the mono-ol compound and the multivalent metallic ion precedes the reaction between the organic binder and the ion, and ionic cross-linking between the organic binder and the multivalent metallic ion and formation of a three-dimensional network are hindered. Since the mono-ol compound has only one hydroxyl group, when it bonds to the multivalent metallic ion, no three-dimensional network is formed by ionic cross-linking. In addition, the compound has a boiling point of about 178° C. or more, and thus, even after a photosensitive conductive paste is applied and dried, the mono-ol compound significantly remains in the dried composition and exhibits sufficient ability to prevent gelation. As a result, consistent development can be carried out.

In the second method for forming a conductive pattern of the present invention, the photosensitive conductive paste contains one or more anion-adsorbing substances such as hydroxyapatite, and therefore gelation of the paste and a dried film can be sufficiently suppressed and a fine conductive pattern can be formed at high accuracy.

In the second method for producing a ceramic multi-layer substrate of the present invention, the photosensitive conductive paste contains the anion-adsorbing substance such as hydroxyapatite, and therefore gelation of the paste and a dried film can be sufficiently suppressed and a fine conductive pattern can be formed on a ceramic green sheet with high accuracy. As a result, a ceramic multi-layer substrate having sufficiently increased signal speed and wiring density can be produced.

The reason why the fine conductive pattern can be formed is that when an anion-adsorbing substance having the property to adsorb an anion is mixed with an organic binder containing an acidic functional group, such as a carboxyl group, which group has a property to free a proton, the anion-adsorbing substance adsorbs the anion of the organic binder which is generated after the proton is freed to thereby form a micro-structure such as a micro-phase-separated substance in the resultant mixture. As a result, the mixture becomes uniform macroscopically although not uniform microscopically, and a three-dimensional network is difficult to form by ionic cross-linking.

In the third method for forming a conductive pattern of the present invention, a photosensitive conductive paste contains one or more thixotropic agents (thixotropy adjusting agent) and therefore gelation of the paste and a dried film can be sufficiently suppressed and a fine conductive pattern can be formed at high accuracy.

In the third method for producing a ceramic multi-layer substrate of the present invention, the photosensitive conductive paste contains the thixotropic agent, and therefore gelation of the paste and a dried film can be sufficiently suppressed and a fine conductive pattern can be formed on a ceramic green sheet with high accuracy. As a result, a ceramic multi-layer substrate having sufficiently increased signal speed and wiring density can be produced.

The reason why the fine conductive pattern can be formed is that when a thixotropic agent is incorporated into a photosensitive conductive paste containing a photosensitive organic binder, the thixotropic agent is entangled with a polymer chain of the organic binder to thereby form a so-called network structure. Gelation of the photosensitive conductive paste and the film proceeds by ionic bonding between the anion of the organic binder and a multivalent metallic ion. However, the anion and the metallic ion must be sufficiently close such that Coulomb forces of these ions act on each other in order to form the ionic bond. In addition, when the network structure is formed by incorporation of the thixotropic agent, additional energy is required in order to break the structure and to form the ionic bond. Therefore, a three-dimensional network formed of the multivalent metal is difficult to form by ionic cross-linking and gelation of the photosensitive conductive paste and the film can be suppressed.

BRIEF DESCRIPTION OF THE DRAWINGS

FIGS. 1A through 1E show the process of one embodiment of the method for forming a conductive pattern of the present invention.

DESCRIPTION OF INVENTION AND PREFERRED EMBODIMENTS

Figure 2:
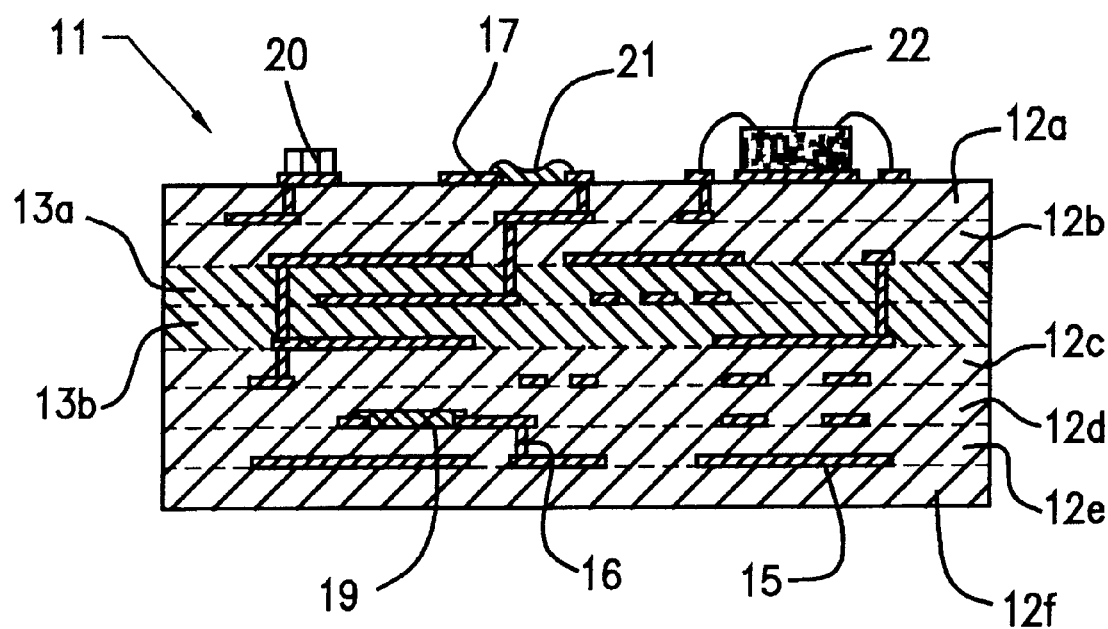
FIG. 2 is a schematic sectional view of a ceramic multi-layer substrate produced by the method of the present invention.

The first method for forming a conductive pattern and the first method for producing a ceramic multi-layer substrate of the present invention are described below.

In the first method for forming a conductive pattern and the first method for producing a ceramic multi-layer substrate of the present invention, examples of the monohydroxy alcohol compounds having a boiling point of about 178° C. or more include 1-octyl alcohol, 2-octyl alcohol, nonyl alcohol, decyl alcohol, 1-methylcyclohexanol, trimethylcyclohexanol, ethylene glycol monoacetate, diethylene glycol monobutyl ether, diethylene glycol monoethyl ether, diethylene glycol monohexyl ether, diethylene glycol monomethyl ether, diethylene glycol monomethyl ether, diethylene glycol monovinyl ether, dipropylene glycol monomethyl ether, dipropylene glycol monoethyl ether, dipropylene glycol monobutyl ether, ethylene glycol isoamyl ether, ethylene glycol phenyl ether, ethylene glycol benzyl ether, trimethylhexanol, tetrahydrofurfuryl alcohol, cresol, butyl lactate, benzyl alcohol, hydroxyethyl acrylate, phenethyl alcohol, mercaptobutanol, hydroxyethyl methacrylate, hydroxyethylpiperazine, cyclohexanone oxime, hydroxymethoxyallylbenzene, hydroxymethoxybenzaldehyde, hydroxymethylpiperazine, hydroxypropionitrile, hydroxyacetonaphthone, hydroxybenzaldehyde, hydroxyacetophenone, hydroxybenzimidazole, phenylphenol, hydroxybenzoic acid, hydroxybenzophenone, benzoin, thymol, hydroxymethoxybenzoic acid, hydroxymethylbenzoic acid, hydroxymethylpyrone, hydroxynaphthoic acid, hydroxynaphthoquinone, hydroxynorbornenedicarboxyimide, hydroxyphenylacetic acid, hydroxyphenylglycine, hydroxyphthalimide, a hydroxypivalic acid neopentyl glycol ester, hydroxypropiophenone, hydroxystearic acid, hydroxysuccinic acid imide, hydroxytoluic acid, pentaerythritol diacrylate monostearate, and a mixture thereof.

The mono-ol compound is preferably contained in a molar amount of at least twice that of the multivalent metallic ions released in a solution portion of the photosensitive conductive paste. When the mono-ol compound is in a molar amount of less than twice, gelation of the paste is difficult to prevent sufficiently. The mol amount of the released multivalent metallic ions can be measured by means of known techniques such as atomic absorption spectrophotometry, ICP, and ICP-MS, after the solid portion and the solution portion of the paste are separated from each other through centrifugation and filtration.

When the photosensitive conductive paste contains an organic solvent, the paste preferably contains the mono-ol compound in an amount of about 10–92 wt. % based on the total amount of the mono-ol compound and the organic solvent. When the amount of the mono-ol compound is less than about 10 wt. %, gelation of the paste is difficult to suppress sufficiently, whereas when the amount is more than about 92 wt. %, the viscosity of the paste decreases considerably and coatability of the paste may be deteriorated. The mono-ol compound may be used as the organic solvent in the photosensitive conductive paste.

The second method for forming a conductive pattern and the second method for producing a ceramic multi-layer substrate will next be described.

In the second method for forming a conductive pattern and the second method for producing a ceramic multi-layer substrate, the aforementioned anion-adsorbing substance is in the form of microparticles preferably having an average particle size of about 0.01–50 μm. An anion-adsorbing substance in the form of microparticles having such a particle size effectively adsorbs anions of an organic binder.

The aforementioned anion-adsorbing substance may be in the form of inorganic microparticles or organic microparticles. Examples of suitable materials of the inorganic microparticles include hydroxyapatite, hydrotalcite, zirconium phosphate and hydrous antimony oxide. Examples of material of the organic microparticles include anion-exchanging resins. Specific examples include:

(1) a copolymer of divinylbenzene and an acrylate, a methacrylate, or acrylonitrile to which a primary, secondary, tertiary, or quaternary amino group is introduced as an ion-exchanging group;

(2) a copolymer of trivinylbenzene and an acrylate, a methacrylate, or acrylonitrile to which a primary, secondary, tertiary, or quaternary amino group is introduced as an ion-exchanging group;

(3) a copolymer of trimethylolpropane trimethacrylate and an acrylate, a methacrylate, or acrylonitrile to which a primary, secondary, tertiary, or quaternary amino group is introduced as an ion-exchanging group; and (4) a copolymer of ethylene glycol dimethacrylate and an acrylate, a methacrylate, or acrylonitrile to which a primary, secondary, tertiary, or quaternary amino group is introduced as an ion-exchanging group.

The third method for forming a conductive pattern and the third method for producing a ceramic multi-layer substrate will next be described.

In the third method for forming a conductive pattern and the third method for producing a ceramic multi-layer substrate, the photosensitive conductive paste contains the aforementioned thixotropic agent in an amount of about 0.001–30 wt. % based on the total amount of the paste, preferably about 0.1–10 wt. %. When the amount is less than about 0.001 wt. %, sufficient prevention of gelation is difficult, whereas when the amount is in excess of about 30 wt. %, handling of the paste is difficult due to excessively high viscosity.

Typically, any agent for thickening, preventing running and preventing sedimentation, agent for preventing running and preventing sedimentation, and agent for wetting and dispersing pigments and preventing sedimentation may be used as the aforementioned thixotropic agent. Examples of the agents for thickening, preventing running and preventing sedimentation include polymerized vegetable oils, polyether-ester surfactants, hydrogenated castor oil, a mixture of hydrogenated castor oil/amides and fatty acid amide waxes. Examples of the agent for preventing running and preventing sedimentation which may be used include specific fatty acids, sulfate ester-type anionic surfactants, polyethylene oxide and a mixture of polyethylene oxide/amides. Examples of the agent for wetting and dispersing pigments and preventing sedimentation which may be used include aliphatic multivalent carboxylic acids, amine salts of high-molecular-weight polyester, polyether-ester anionic surfactants, long-chain amine salts of high-molecular-weight polycarboxylic acid, salts of long-chain polyaminoamides and high-molecular-weight polyester acid, salts of long-chain polyaminoamides and phosphoric acid, specific modified polyamides, phosphate ester surfactants, and amidoamine salts of high-molecular-weight polyester acid.

In the present invention, known photopolymerizable compounds or photochangeable compounds may be used as the aforementioned photosensitive organic components. Examples include (1) mixtures of a monomer or oligomer having a reactive functional group such as an unsaturated group and a photo-radical-initiator such as an aromatic carbonyl compound;

(2) diazo resins such as a condensate of an aromatic bisazide and formaldehyde;

(3) mixtures of an addition-polymerizable compound such as an epoxy compound and a photo-acid-generator such as a diaryliodonium salt; and (4) naphthoquinonediazide compounds. Of these, mixtures of a monomer or oligomer having a reactive functional group such as an unsaturated group and a photo-radical-initiator such as an aromatic carbonyl compound are particularly preferred.

Examples of monomers or oligomers having a reactive functional group include hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol acrylate, 1,4-butanediol acrylate, 1,9-nonanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate, trimethylolpropane trimethacrylate, EO-modified isocyanuric acid diacrylate, ethoxylated p-cumylphenol acrylate, ethylhexylcarbitol acrylate, N-vinyl-2-pyrrolidone, isobornyl acrylate, polypropylene glycol diacrylate, polyethylene glycol diacrylate, dipentaerythritol pentaacrylate, and dipentaerythritol hexaacrylate.

Examples of the aforementioned photo-radical-generators include benzil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylaminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropan-1-one, 2,2-dimethoxy-1,2-diphenylethan-1-one, hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, methylbenzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl)phenylphosphine oxide.

In the present invention, the aforementioned organic binder having an acidic functional group such as a carboxyl group may be an acrylic copolymer having a carboxylic side chain. The material of the aforementioned multivalent metallic powder may be at least one species selected from the group consisting of copper, aluminum, palladium, nickel and iron. The term "multivalent metal" refers to a metal having a valency of at least 2.

Typical conductive materials used for preparing a conductive paste include Cu, Al, Pd, Ni, Fe, Pt, Au, Ag, Mo, W and alloys thereof. Particularly among conductive metallic powders incorporated in a photosensitive conductive paste, multivalent metallic powders formed of Cu, Al, Pd, Ni and Fe, or alloys thereof, release the corresponding ions in the paste or a coating film of the paste, and the released ions react with an organic binder having an acidic functional group such as a carboxyl group having a proton-releasing property to thereby cause gelation. However, when measures are taken against gelation in accordance with the present invention, gelation can be effectively prevented and excellent properties in terms of, for example, applicability to a support, solubility during development and transferability to a green sheet can be obtained.

Specifically, when the aforementioned organic binder is an acrylic copolymer having a carboxylic side chain and the aforementioned conductive metallic powder is a powder of a multivalent metal such as copper, aluminum, palladium, nickel or iron, a three-dimensional network structure due to ionic cross-linking tends to be formed particularly easily. The aforementioned mono-ol compound, anion-adsorbing compound and/or thixotropic agent is added to such a system to thereby significantly prevent gelation thereof.

The aforementioned acrylic copolymer may be produced through copolymerization of an unsaturated carboxylic acid and an ethylenic unsaturated compound. Examples of unsaturated carboxylic acids include acrylic acid, methacrylic acid, maleic acid, flimaric acid, vinyl acetate, and anhydrides thereof. Examples of ethylenic unsaturated compounds include acrylate esters such as methyl acrylate and ethyl acrylate; methacrylate esters such as methyl methacrylate and ethyl methacrylate; and fumarate esters such as monoethyl fumarate. Alternatively, the aforementioned acrylic copolymer to which an unsaturated bond in the following forms has been introduced may also be used:

(1) an acrylic copolymer obtained through addition of an acrylic monomer having a functional group, e.g., an epoxy group, reactive to a carboxyl group in a side chain of the aforementioned acrylic copolymer, and (2) an acrylic copolymer obtained through reaction of an unsaturated monocarboxylic acid with an acrylic copolymer having an epoxy group in a side chain instead of a carboxyl group and further introduction of a saturated or unsaturated multivalent carboxylic anhydride.

The photosensitive conductive paste of the present invention may contain optional additives including a storage stabilizer such as a polymerization inhibitor; an anti-oxidant; a dye; a pigment; a defoaming agent; and a surfactant. The aforementioned organic solvent may chosen from among known organic solvents.

A mode of a method for forming a conductive pattern according to the present invention will be specifically described by reference to FIGS. 1A–1E.

As is shown in FIG. 1A, a photosensitive conductive paste is applied to a support 1 by means of spin coating, screen printing or a doctor blade process, and the paste is dried at 50–150° C. for 10 minutes to two hours to thereby form a film 2 of the paste.

Subsequently, as is shown in FIG. 1B, active rays from a high pressure mercury lamp having an exposure of 20–5,000 mJ/cm$^2$ are applied to the film 2 formed on the support 1 through a mask 5 having the desired pattern, and the film 2 is thus exposed to a predetermined pattern. As a result, portions to which the rays are applied (exposed portions) 3a and 3b are cured, and the portions become regions which are not developed in the subsequent development treatment.

Next, as is shown in FIG. 1C, a widely used aqueous alkali solution such as an aqueous solution of sodium carbonate is applied, by means of a spray shower, to the film having the exposed portions 3a and 3b and unexposed portions 2a, 2b, and 2c. As a result, the unexposed portions 2a, 2b, and 2c dissolve in the aqueous alkali solution (development), and conductive patterns 3a and 3b are formed on the support 1.

Subsequently, as is shown in FIG. 1D, the conductive patterns 3a and 3b formed on the support 1 are thermally transferred onto a ceramic green sheet 6 by use of a typical thermal pressing apparatus, at 1–200 MPa and 50–150° C. for five seconds to five minutes.

Next, as is shown in FIG. 1E, the support 1 is peeled off the ceramic green sheet 6 to thereby form the fine conductive patterns 3a and 3b on the sheet 6 at high accuracy.

Accordingly, in a method for forming a conductive pattern according to the present invention, gelation of a photosensitive conductive paste can be suppressed, and thus application of the paste to a support can be carried out smoothly. In addition, gelation of a dried film of the paste can be suppressed sufficiently, and thus exposure and development can be carried out consistently. Therefore, a fine conductive pattern can be formed on an arbitrary substrate at high accuracy.

Typical film-type supports suitably used as the support 1 for transfer include a polyester film, a polypropylene film and a nylon film. In order to enhance transferability of the conductive pattern, the film-type support may be subjected to a mold release treatment such as application of a silicon coating, wax coating or melamine coating. However, the photosensitive conductive paste of the present invention exhibits exceptionally excellent transferability, and thus the support rarely requires such a release treatment. Peelability between the support and a ceramic green sheet may become low, depending on the type of organic binder used in the sheet. In such a case, the support may be appropriately subjected to a known surface treatment.

In the above mode, a ceramic green sheet can be used as a substrate on which a conductive pattern is to be formed, but a method for forming a conductive pattern of the present invention is not limited to formation of a conductive pattern on the ceramic green sheet. The method is applicable to a variety of substrates, including formation of a conductive pattern on an insulating ceramic layer, a dielectric ceramic layer and a print substrate. In addition, the photosensitive conductive paste may be either a negative paste or a positive paste.

A ceramic multi-layer substrate produced by means of a method for producing a ceramic multi-layer substrate according to the present invention will be described by reference to FIG. 2.

A ceramic multi-layer substrate 11 shown in FIG. 2 is a multi-layer circuit substrate containing insulating layers 12a, 12b, 12c, 12d, 12e and 12f and dielectric layers 13a and 13b. In the ceramic multi-layer substrate 11, a capacitor pattern, a coil pattern, and a strip line are formed by use of internal layer conductive patterns 15 and via holes 16. In addition, on a primary surface of the ceramic multi-layer substrate 11 are placed a chip component 20 such as a chip capacitor, a thick-film resistor 21, and a semiconductor IC 22, and these components are connected to a surface layer conductive pattern 17 and the internal layer conductive pattern 15.

The ceramic multi-layer substrate 11 can be produced, for example, by the following procedure.

Glass powder, ceramic powder and an organic vehicle are mixed to prepare a slurry for an insulating ceramic green sheet. In the same manner, a slurry for a dielectric ceramic green sheet is prepared. The thus-prepared respective slurries are formed into sheets by means of the doctor blade method and dried at 50–150° C. to thereby form an insulating ceramic green sheet and a dielectric ceramic green sheet.

On the thus-formed respective ceramic green sheets, conductive patterns serving as a capacitor pattern, a coil pattern, and the like, are formed. In accordance with need, via holes are formed on the respective green sheets. In this case, the conductive patterns are formed by means of a method for forming a conductive pattern according to the present invention as illustrated in FIGS. 1A–1E.

Subsequently, the ceramic green sheets on which the conductive patterns and the via holes are formed are stacked, pressed and fired at a predetermined temperature. A conductive pattern is formed on a surface layer in the same manner, i.e., by means of a method for forming a conductive pattern according to the present invention. Thereafter, the chip component 20 and the semiconductor IC 22 are placed on the surface layer, and the thick-film resistor 21 is printed on the surface layer.

In the method for producing a ceramic multi-layer substrate according to the present invention, gelation of a photosensitive conductive paste can be suppressed and thus application of the paste to a support can be carried out smoothly. In addition, gelation of a dried film of the paste can be suppressed sufficiently, and thus exposure and development can be carried out consistently. Therefore, a fine conductive pattern can be formed at high accuracy on a ceramic green sheet serving as a substrate. As a result, a ceramic multi-layer substrate having sufficiently increased signal speed and wiring density can be produced.

The aforementioned ceramic multi-layer substrate may serve as a multi-layer substrate used in high-frequency chip electronic components such as a chip inductor and a chip laminated capacitor, in high-frequency modules such as a PLL module and a voltage-controlled oscillator, or in a hybrid IC.

EXAMPLES

The present invention will next be described by way of examples.

Example 1

The below-described compositional materials were mixed, and the resultant mixture was kneaded by use of a three-roll mill, to thereby prepare a photosensitive conductive paste.
Organic Binder
  A copolymer of methacrylic acid and methyl methacrylate in which the weight ratio of methacrylic acid to methyl methacrylate is 25/75 (weight average molecular weight= 50,000): 2.0 g
Conductive Material
  Copper powder: 9.0 g
Reactive Functional Group-containing Monomer
  Trimethylolpropane triacrylate: 1.0 g
Photopolymerization Initiator
  2-Methyl-1-[4-(methylthio)phenyl]-2-morpholinopropane-1-one: 0.4 g
  2,4-diethylthioxanthone: 0.1 g
Organic Solvent
  Ethylcarbitol acetate: 4.0 g
Mono-ol Compound
  Dipropylene glycol monomethyl ether: 4.0 g Subsequently, the thus-prepared photosensitive conductive paste was applied to a polyester film by use of a spin coating apparatus and dried at 50° C. for one hour to thereby form a film having a thickness of 20 μm. Thereafter, rays of a high pressure mercury lamp at 250 mJ/cm$^2$ were applied to the thus-formed film through a mask having a line/space (L/S) pattern:=20/20 (μm). The resultant film was developed by use of an aqueous solution of sodium carbonate to thereby form a conductive pattern of L/S=20/20 (μm) on the polyester film. After being allowed to stand for 200 hours, the polyester film was stacked on a ceramic green sheet, and the laminate was pressed with heat at 10 MPa and 60° C. for one minute. Subsequently, the polyester film was peeled off, and the conductive pattern was thermally transferred onto the ceramic green sheet. Thereafter, the sheet was subjected to a degreasing treatment and fired in air at 900° C. to thereby form a conductive pattern having L/S=15/20 (μm) and a thickness of 8 μm.

Example 2

The procedure of Example 1 was repeated, except that dipropylene glycol monomethyl ether was replaced by 1-heptyl alcohol to thereby prepare a photosensitive conductive paste. In addition, the procedure of Example 1 was repeated by use of the thus-prepared paste, to thereby form a conductive pattern on a ceramic green sheet.

Example 3

The procedure of Example 1 was repeated, except that dipropylene glycol monomethyl ether was replaced by 2-octyl alcohol to thereby prepare a photosensitive conductive paste. In addition, the procedure of Example 1 was repeated by use of the thus-prepared paste to thereby form a conductive pattern on a ceramic green sheet.

Example 4

The procedure of Example 1 was repeated, except that dipropylene glycol monomethyl ether was replaced by butyl lactate to thereby prepare a photosensitive conductive paste. In addition, the procedure of Example 1 was repeated by use of the thus-prepared paste to thereby form a conductive pattern on a ceramic green sheet.

Comparative Example 1

The procedure of Example 1 was repeated, except that dipropylene glycol monomethyl ether was replaced by 3-methoxy-3-methyl-butanol to thereby prepare a photosensitive conductive paste. In addition, the procedure of Example 1 was repeated by use of the thus-prepared paste to thereby form a conductive pattern on a ceramic green sheet.

Comparative Example 2

The procedure of Example 1 was repeated, except that dipropylene glycol monomethyl ether was replaced by 4-methylcyclohexanol to thereby prepare a photosensitive conductive paste. In addition, the procedure of Example 1 was repeated by use of the thus-prepared paste to thereby form a conductive pattern on a ceramic green sheet.

The conductive patterns formed in Examples 1 to 4 and Comparative Examples 1 and 2 were subjected to measurement of percent transfer onto a ceramic green sheet. The results are shown in Table 1. Boiling points of the respective mono-ol compounds are also shown in Table 1. The term "percent transfer" refers to the ratio of the area of a conductive pattern on a ceramic green sheet after transfer to that on a polyester film before transfer. In this case, a small percent transfer means that the conductive pattern remains on the polyester film.

TABLE 1

|  | Mono-ol compound | Boiling point | Percent transfer |
|---|---|---|---|
| Example 1 | Dipropylene glycol monomethyl ether | 189–190° C. | 100% |
| Example 2 | 1-Heptyl alcohol | 176° C. | 70% |
| Example 3 | 2-Octyl alcohol | 178–179° C. | 97% |
| Example 4 | Butyl lactate | 185–187° C. | 100% |
| Comparative | 3-Methoxy-3-methyl- | 173–175° C. | 25% |

TABLE 1-continued

| | Mono-ol compound | Boiling point | Percent transfer |
|---|---|---|---|
| Example 1 | butanol | | |
| Comparative Example 2 | 4-Methylcyclohexanol | 172–175° C. | 30% |

As is apparent from Table 1 Examples 1 to 4, when the photosensitive conductive paste containing the mono-ol compound having a boiling point of about 178° C. or more is used for forming the conductive pattern, the percent transfer of the pattern onto the ceramic green sheet is very high. The results show that the fine conductive pattern is formed on the ceramic green sheet with high accuracy through the above-described transferring method. In contrast, as in the cases of Comparative Examples 1 and 2, when the paste containing the mono-ol compound has a boiling point of less than about 178° C., the percent transfer of the pattern onto the ceramic green sheet is very low. The results show that gelation of the film or the conductive pattern may occur on the polyester film.

The photosensitive conductive paste prepared in Example 1 was stored in air at 20° C. for evaluation of storage stability. As a result, the paste did not gel just after preparation, nor did the paste gel one day, three days, one week and one month after preparation. After each of the periods described above, the paste was able to be applied to a polyester film by use of a spin coating apparatus and a conductive pattern could be formed by use of the paste through photolithography.

Example 5

The below-described compositional materials were mixed, and the resultant mixture was kneaded by use of a three-roll mill, to thereby prepare a photosensitive conductive paste.

Organic Binder

A copolymer of methacrylic acid and methyl methacrylate in which the weight ratio of methacrylic acid to methyl methacrylate is 25/75 (weight average molecular weight=50,000): 2.0 g Anion-adsorbing Micro Particles Hydroxyapatite (mean particle size: 5 μm): 0.1 g Conductive Material Copper powder: 9.0 g Reactive Functional Group-containing Monomer Trimethylolpropane triacrylate: 1.0 g Photopolymerization Initiator 2-Methyl-1-[4-(methylthio)phenyl]-2-morpholinopropane-1-one: 0.4 g 2,4-diethylthioxanthone: 0.1 g Organic Solvent Ethylcarbitol acetate: 4.0 g Propylene glycol monomethyl ether acetate: 1.0 g Subsequently, the thus-prepared photosensitive conductive paste was applied to a polyester film by use of a spin coating apparatus and dried at 50° C. for one hour to thereby form a film having a thickness of 20 μm. Thereafter, rays from a high pressure mercury lamp at 250 mJ/cm$^2$ were applied to the thus-formed film through a mask having a line/space (L/S) pattern:=20/20 (μm). The resultant film was developed by use of an aqueous solution of sodium carbonate to thereby form a conductive pattern of L/S=20/20 (μm) on the polyester film. After being allowed to stand for 200 hours, the polyester film was stacked on a ceramic green sheet, and the laminate was pressed with heat at 10 MPa and 60° C. for one minute. Subsequently, the polyester film was peeled off, and the conductive pattern was thermally transferred onto the ceramic green sheet. Thereafter, the sheet was subjected to a degreasing treatment and fired in air at 900° C. to thereby form a conductive pattern having L/S=15/20 (μm) and a thickness of 8 μm.

Example 6

The procedure of Example 5 was repeated, except that hydroxyapatite was replaced by a thixotropic agent (Disparlon 305, product of Kusumoto Chemicals, Ltd.: hydrogenated-castor-oil-type) (0.1 g) to thereby prepare a photosensitive conductive paste. In addition, the procedure of Example 5 was repeated by use of the thus-prepared paste to thereby form a conductive pattern on a ceramic green sheet.

Comparative Example 3

The procedure of Example 5 was repeated, except that hydroxyapatite was not added, to thereby prepare a photosensitive conductive paste. In addition, the procedure of Example 5 was repeated by use of the thus-prepared paste to thereby form a conductive pattern on a ceramic green sheet.

Comparative Example 4

The procedure of Example 5 was repeated, except that hydroxyapatite was replaced by phosphoric acid (0.1 g) to thereby prepare a photosensitive conductive paste. In addition, the procedure of Example 5 was repeated by use of the thus-prepared paste to thereby form a conductive pattern on a ceramic green sheet.

Comparative Example 5

The procedure of Example 5 was repeated, except that hydroxyapatite was replaced by benzotriazole (0.02 g) to thereby prepare a photosensitive conductive paste. In addition, the procedure of Example 5 was repeated by use of the thus-prepared paste to thereby form a conductive pattern on a ceramic green sheet.

The conductive patterns formed in Examples 5 and 6 and Comparative Examples 3 to 5 were evaluated in terms of percent transfer onto a ceramic green sheet. The results are shown in Table 2.

TABLE 2

| | Additive | Percent transfer |
|---|---|---|
| Example 5 | Hydroxyapatite | 100% |
| Example 6 | Disparlon 305 | 100% |
| Comparative Example 3 | None | . . . |
| Comparative Example 4 | Phosphoric acid | 70% |
| Comparative Example 5 | Benzotriazole | 72% |

As is apparent from Table 2 Example 5, when the photosensitive conductive paste containing hydroxyapatite serving as an anion-adsorbing substance is used for forming the conductive pattern, the percent transfer of the pattern onto the ceramic green sheet is very high. Also, as in the case of Example 6, when the photosensitive conductive paste containing the thixotropic agent is used, the percent transfer of the pattern onto the ceramic green sheet is very high. The results show that the fine conductive pattern is formed on the ceramic green sheet with high accuracy through the above-described transferring method. In contrast, the percent transfer of the pattern onto the ceramic green sheet is very low in the cases of Comparative Examples 3 to 5. The results show that gelation of the film may occur on the polyester film.

The photosensitive conductive pastes prepared in Example 5 and 6 were stored in air at 20° C. for evaluation of storage stability. As a result, it was found that the pastes did not gel just after preparation, nor did the pastes gel one day, three days, one week and one month after preparation. After each of the periods described above, any of the pastes could be applied to a polyester film by use of a spin coating apparatus, and a conductive pattern could be formed by use of each of the pastes through photolithography. In the same way as for these pastes, the photosensitive conductive paste prepared in Comparative Example 3 was evaluated for storage stability. However, the paste gelled 24 hours after preparation and a conductive pattern could not be formed on a polyester film by use of the paste.

As is described above, when a so-called transferring method is employed, prevention of gelation of a photosensitive conductive paste provides a fine conductive pattern on a ceramic green sheet with high accuracy.

In a method for forming a conductive pattern of the present invention, the photosensitive conductive paste contains a mono-ol compound having a boiling point of about 178° C. or more, an anion-adsorbing agent such as hydroxyapatite and/or a thixotropic agent, and therefore gelation of the paste and a dried film can be sufficiently suppressed and a fine conductive pattern can be formed at high accuracy.

In a method for producing a ceramic multi-layer substrate of the present invention, the photosensitive conductive paste contains a mono-ol compound having a boiling point of about 178° C. or more, an anion-adsorbing agent such as hydroxyapatite and/or a thixotropic agent, and therefore gelation of the paste and a dried film can be sufficiently suppressed and a fine conductive pattern can be formed on a ceramic green sheet with high accuracy. As a result, a ceramic multi-layer substrate having sufficiently increased signal speed and wiring density can be produced.

What is claimed is:

1. A method for forming a conductive pattern, comprising the steps of:
    applying a photosensitive conductive paste to a support, the photosensitive conductive paste comprising an organic binder having an acidic functional group, a photosensitive organic component, a multivalent metallic powder, and at least one member selected from the group consisting of (a) a mono-ol compound having a boiling point of about 178° C. or more, and (b) an anion-adsorbing substance having ability to adsorb the anion of the organic binder;
    forming a predetermined conductive pattern by exposure and development of the photosensitive conductive paste; and
    transferring the conductive pattern formed on the support onto a substrate.

2. A method for forming a conductive pattern according to claim 1 wherein the member of the group is said mono-ol.

3. A method for forming a conductive pattern according to claim 2 wherein the mono-ol selected from the group consisting of dipropylene glycol monomethyl ether, heptyl alcohol and octyl alcohol.

4. A method for forming a conductive pattern according to claim 1 wherein the member of the group is said anion-adsorbing substance.

5. A method for forming a conductive pattern according to claim 4 wherein said anion-adsorbing substance is hydroxyapatite.

6. A method for forming a conductive pattern according to claim 1, wherein the multivalent metal powder is a powder of at least one metal selected from the group consisting of copper, aluminum, palladium, nickel and iron or an alloy thereof.

7. A method for producing a ceramic multi-layer substrate, comprising the steps of:
    applying a photosensitive conductive paste to a support, the photosensitive conductive paste comprising an organic binder having an acidic functional group, a photosensitive organic component, a multivalent metallic powder, and at least one member selected from the group consisting of (a) a mono-ol compound having a boiling point of about 178° C. or more, and (b) an anion-adsorbing substance having ability to adsorb the anion of the organic binder;
    forming a predetermined conductive pattern by exposure and development of the photosensitive conductive paste;
    transferring the conductive pattern formed on the support onto a ceramic green sheet; and
    stacking a plurality of the ceramic green sheets having the conductive pattern and firing the resultant laminate.

8. A method for forming a conductive pattern according to claim 7 wherein the member of the group is said mono-ol.

9. A method for forming a conductive pattern according to claim 8 wherein the mono-ol selected from the group consisting of dipropylene glycol monomethyl ether, heptyl alcohol and octyl alcohol.

10. A method for forming a conductive pattern according to claim 7 wherein the member of the group is said anion-adsorbing substance.

11. A method for forming a conductive pattern according to claim 10 wherein said anion-adsorbing substance is hydroxyapatite.

12. A method for forming a conductive pattern according to claim 7 wherein the multivalent metal powder is a powder of at least one metal selected from the group consisting of copper, aluminum, palladium, nickel and iron or an alloy thereof.

* * * * *